(12) United States Patent
Houbertz et al.

(10) Patent No.: US 11,130,199 B2
(45) Date of Patent: Sep. 28, 2021

(54) DEVICE AND METHOD FOR LASER-ASSISTED PROCESSING OF BODIES OR SURFACES

(71) Applicant: MULTIPHOTON OPTICS GMBH, Wuerzburg (DE)

(72) Inventors: Ruth Houbertz, Wuerzburg (DE); Alexander Krupp, Wuerzburg (DE); Benedikt Stender, Wuerzburg (DE)

(73) Assignee: Multiphoton Optics GmbH, Wuerzburg (DE)

( * ) Notice: Subject to any disclaimer, the term of this patent is extended or adjusted under 35 U.S.C. 154(b) by 130 days.

(21) Appl. No.: 16/328,403

(22) PCT Filed: Aug. 18, 2017

(86) PCT No.: PCT/EP2017/070960
§ 371 (c)(1),
(2) Date: Feb. 26, 2019

(87) PCT Pub. No.: WO2018/036930
PCT Pub. Date: Mar. 1, 2018

(65) Prior Publication Data
US 2019/0193204 A1    Jun. 27, 2019

(30) Foreign Application Priority Data
Aug. 26, 2016   (EP) .................................... 16185821

(51) Int. Cl.
*B23K 26/354*  (2014.01)
*B29C 64/135*  (2017.01)
(Continued)

(52) U.S. Cl.
CPC ........ *B23K 26/354* (2015.10); *B23K 26/0622* (2015.10); *B23K 26/34* (2013.01);
(Continued)

(58) Field of Classification Search
CPC .... B33Y 30/00; B23K 26/0622; B23K 26/34; B23K 26/354; B29C 64/135;
(Continued)

(56) References Cited

U.S. PATENT DOCUMENTS 6,327,026 B1 * 12/2001 Wakui .................... G03F 7/707
355/53
9,434,818 B2    9/2016 Popall et al.
(Continued)

FOREIGN PATENT DOCUMENTS

DE          4102260 A1      7/1992
DE          10111422 A1     9/2002
(Continued)

*Primary Examiner* — Philip C Tucker
*Assistant Examiner* — Jimmy R Smith, Jr.
(74) *Attorney, Agent, or Firm* — Laurence A. Greenberg; Werner H. Stemer; Ralph E. Locher

(57) ABSTRACT

A device performs laser-assisted processing of a material adhering to a substrate or of a substrate associated or substrate-free body or of its surface. The device has a positioning system enabling three translational and three rotational degrees of freedom and having a sample holder. The sample holder holds the substrate to which the material to be processed adheres or to which the body to be processed is associated or, in the absence of a substrate, the body to be processed. The device has a laser source emitting laser pulses and focusing optics which shape the laser pulses such that they impinge in a focal point or a focal volume in the region of the material or body to be processed in such a way that a two-photon or multi-photon polymerization takes place.

18 Claims, 5 Drawing Sheets

(51) Int. Cl.
  *B33Y 30/00* (2015.01)
  *B23K 26/0622* (2014.01)
  *B29C 64/273* (2017.01)
  *B23K 26/34* (2014.01)
  *G03F 7/20* (2006.01)
  *G03F 7/00* (2006.01)
  *B29C 64/40* (2017.01)
  *B33Y 10/00* (2015.01)

(52) U.S. Cl.
  CPC .......... *B29C 64/135* (2017.08); *B29C 64/273* (2017.08); *B29C 64/40* (2017.08); *B33Y 10/00* (2014.12); *B33Y 30/00* (2014.12); *G03F 7/0037* (2013.01); *G03F 7/2053* (2013.01); *G03F 7/70416* (2013.01)

(58) Field of Classification Search
  CPC ... B29C 64/273; B29C 64/245; B29C 64/379; B29C 64/227; B29C 64/232; B29C 64/236; B29C 64/241
  See application file for complete search history.

(56) References Cited

U.S. PATENT DOCUMENTS

| | | | |
|---|---|---|---|
| 2001/0032111 | A1* | 10/2001 | Jensen, Jr. .......... G06Q 10/087 705/7.12 |
| 2013/0056910 | A1* | 3/2013 | Houbertz-Krauss ........................ B29C 64/386 264/401 |
| 2013/0093871 | A1 | 4/2013 | Nowatzyk et al. |
| 2014/0051821 | A1 | 2/2014 | Popall et al. |
| 2014/0092372 | A1 | 4/2014 | DeVoe et al. |
| 2016/0236279 | A1* | 8/2016 | Ashton ...................... G01J 3/28 |
| 2017/0173736 | A1* | 6/2017 | Gray ...................... B33Y 30/00 |
| 2017/0282453 | A1 | 10/2017 | Houbertz et al. |

FOREIGN PATENT DOCUMENTS

| | | |
|---|---|---|
| EP | 1262835 A2 | 12/2002 |
| WO | 03037606 A1 | 5/2003 |
| WO | 2011141521 A1 | 11/2011 |
| WO | 2012097836 A1 | 7/2012 |

\* cited by examiner

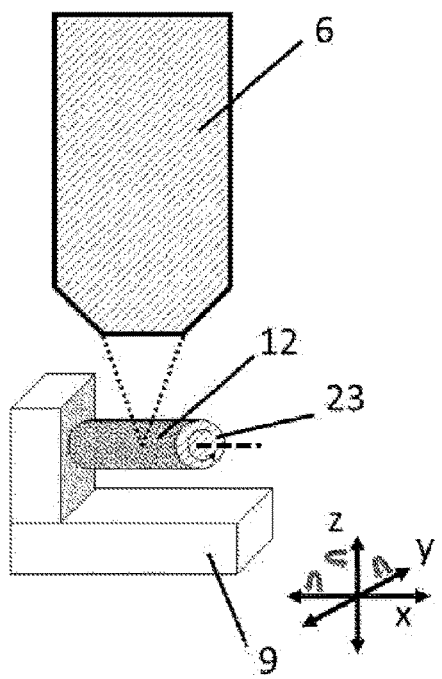 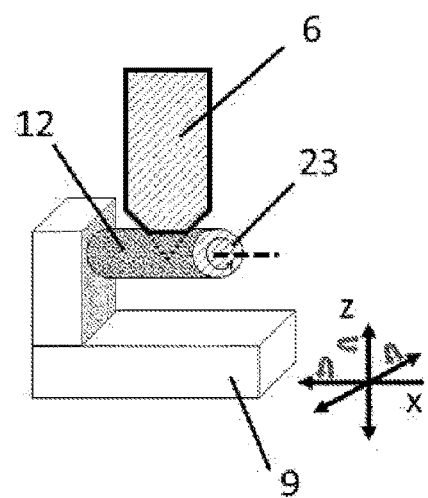
Fig. 9a  Fig. 9b
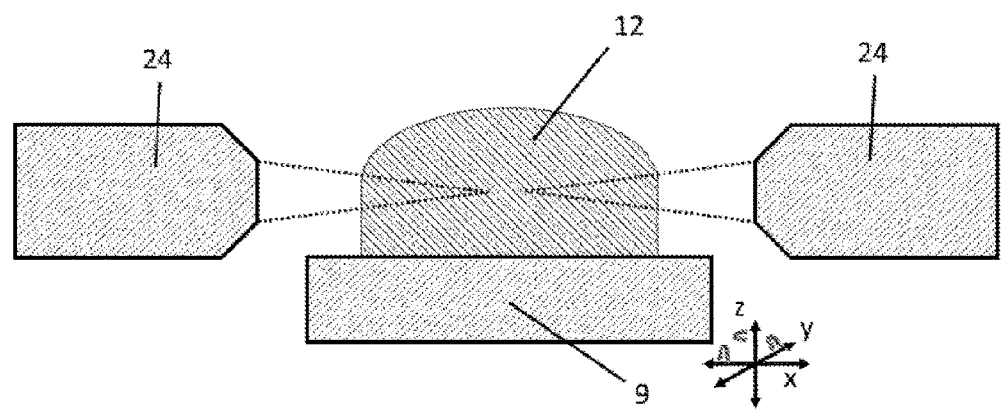
Fig. 10

DEVICE AND METHOD FOR LASER-ASSISTED PROCESSING OF BODIES OR SURFACES

BACKGROUND OF THE INVENTION

Field of the Invention

This invention relates to a device for the laser-assisted machining of bodies or surfaces and processes using this device. The device is suitable for e.g. for producing three-dimensional structures, for example of or in bodies, or of or in surfaces of a material to be solidified or for processing surfaces or bodies, preferably of glass or glass ceramic or metal or of metallic films or structures on a non-metallic surface, preferably by site-selective irradiation using two- or multi-photon absorption processes (hereinafter abbreviated as TPA for two photon absorption or MPA for multi photon absorption) or using pulsed lasers such as ultrashort pulse lasers.

3D lithography systems (also referred to as high-precision 3D printers) for the additive and subtractive production of multidimensional structures on surfaces/volumes of any shape by means of multi-axis systems using multi-photon processes are basically known.

From the prior art it is known, among other things, to produce three-dimensional bodies or surface structures e.g. by light-induced processes, in particular by organic cross-linking, by first producing only one layer or plane as a two-dimensional component of the structure to be created and then building up the three-dimensional structure of the body or surface structure by successively processing successive two-dimensional layers or planes. Examples of such two-dimensional processes are stereolithography, selective laser sintering (SLS) or 3D printing (3DP).

In a special embodiment of stereolithography, the exposure takes place through the transparent bottom of the bath container in order to avoid an interaction of the resulting body with the gas atmosphere above the surface of the bath, e.g. an oxidation reaction. The liquid material is solidified in the immediate vicinity of the container bottom. In order to prevent the solidifying material from adhering to the floor, the latter must be coated with a non-polymerisable liquid as a separating layer, see DE 41 02 260 A1. This makes the process difficult to control, because when the carrier platform is moved, the solidifiable liquid must be able to flow into the gap between the separating layer and the last solidified layer without the separating liquid being swirled. The process is therefore hardly suitable for the production of bodies from highly viscous starting materials, such as solvent-free or solvent-containing organo-polysiloxanes.

Faster processes offer three-dimensional processes in which material-modifying radiation interacts directly in the volume of a raw, solid or liquid starting material. From WO 03/037606 A1, the use of two- or multiphoton polymerization for the consolidation of organopolysiloxane-containing materials is known (polymerization takes place by two- (TPA) or multiphoton absorption).

A disadvantage of known three-dimensional processes and devices for their implementation is that structures, especially with high demands on accuracy, can only be produced with a limited size in the micrometer range. This disadvantage is due to the small working distance of the optics required to achieve sufficient accuracy, i.e. the distance between the focal plane and the exit lens of the optics, which is usually variable and dependent on the numerical aperture of the optics used. The working distance for high-resolution optics with a numerical aperture of NA=0.9 to 1.4 is approx. 500 µm to 190 µm. In known processes or devices for material solidification by multiphoton polymerization, the material to be solidified is arranged, for example, in the amount of a drop between two optical plates as a slide or adhering to an open slide. To enable exposure under defined conditions, exposure must take place across a defined boundary surface. In the case of material placed between two plates, exposure takes place through one of the two plates from above or below. In the case of an open slide on which the material rests, exposure takes place, for example, from below through the underside of the slide. This has the disadvantage that larger structures cannot be solidified, because due to the exposure through or across the slide material on the side of the slide facing away from the optics solidification can only be achieved within a limited distance from the slide, determined by the working distance of the optics. With the currently known three-dimensional solidification processes, the size of the structures that can be produced is limited to about 100 µm to 700 µm, depending on the accuracy to be achieved, provided that no stitching, i.e. subsequent joining of previously structured areas, takes place.

DE 101 11 422 A proposes for a similar procedure to arrange the bath container on a table movable in the XY plane and to provide a construction platform therein which is movable in the Z direction in a controlled manner in order to be able to variably position the focal point in an appropriate manner. Exposure takes place from above into the open bath surface. Alternatively, the focus can be—moved in X and Y direction using a scanner system, i.e. with one or more movable mirrors. With this system, optics with high numerical aperture cannot be used and thus high structure resolution cannot be achieved simultaneously with a freely selectable shaped body size. Errors are further caused by exposure the across the open bath surface, which is not a clean optical surface.

WO 2011/141521 A1 describes two different devices for the generation of three-dimensional structures from a material to be solidified due to light-induced organic cross-linking. The devices each have a laser source, a movable focusing optics for forming one or more laser foci and a material container for the material to be solidified. In the first device, the material container consists at least partially of a material which is transparent to the laser radiation used and is arranged or arrangeable in the beam path in such a way that the laser radiation can be introduced through the material container into the material to be solidified, the material container acts as an optically defined boundary surface and a carrier unit which can be positioned relative thereto is arranged in the material container.

With the devices of WO 2011/141521 A1, it is thus possible to produce three-dimensional bodies of any shape from materials to be solidified in situ by light-induced cross-linking processes over a wide range of wavelengths using a wide variety of laser and optical systems. In general, a large number of material classes can be processed in parallel and over a large area.

By using known positioning systems, both small structures with dimensions of less than one millimeter and macroscopic bodies with an edge length of several centimeters can be produced. This means that either the material to be solidified or a carrier unit immersed therein can be rotated about at least one spatial axis. Substrates in the form of rolled foils or the like can be used, which then function as a carrier unit or are positioned by means of such a unit. The foil-like substrates can be guided using the rotational positioning and positioned relative to at least one laser focus. Rotational positioning is preferably performed with a resolution of at least 0.079 arc seconds and/or an accuracy of at least 3 micro arc seconds. The maximum rotation speed is preferably approx. 300 rpm with a repeatability of less than 2 arc seconds.

A version of the WO 2011/141521 A1 is shown in FIG. 10. A rotary table is used for this purpose, which enables rotary positioning, e.g. around a rotary axis, in addition to or as an alternative to linear positioning. The rotary table shown in FIG. 10 serves to position a foil-shaped carrier unit with material to be solidified relative to the focus. In the embodiment shown in FIG. 11, a carrier unit that can be rotated about a rotation axis and positioned linearly in the Z direction dips into a bath of material to be solidified. The focusing optics can be positioned linearly in X and Y direction. The focus position is set in such a way that material solidifies, deposits and is virtually wound up on the carrier unit.

However, the possibilities of WO 2011/141521 A1 reach their limits if the substrate is not flat or is not uniformly and symmetrically positioned around an axis. But even in the case of axially symmetrical substrates, the effort required to move the components is relatively high. The same also applies to processes using the solidification of a material by means of two- or multi-photon polymerisation, in which the irradiation does not take place through a bath bottom or by immersing the focusing optics in the material to be solidified.

This can be illustrated by the following considerations, which apply to a large number of laser-assisted processes. According to the invention, laser-assisted processes include, for example, the solidification of liquid or pasty materials (organic polymers or inorganic-organic hybrid polymers) using MPA/TPA, the structural modification of the solubility of parts of already solid materials (organic polymers, inorganic-organic hybrid polymers) using MPA/TPA (in particular by bond breakage), the structural modification of physical properties of glasses or glass ceramics, in the inside of which phase transitions and/or redox reactions are triggered, which can lead to an altered, e.g. increased solubility in relation to a solvent such as HF, $NH_4F$ or mixtures thereof, and the processing of solid surfaces (inorganic, organic, inorganic-organic or metallic) using MPA/TPA. The invention also includes laser-assisted surface treatments of metals and other materials: It is possible, for example, to structure metals using ultrashort pulse lasers, whereby material on the surface is vaporized or ablated. This process can be used, for example, to produce extremely fine bores. The aforementioned options processing methods are not to be construed as limiting.

If an (arbitrarily shaped) body (inside or on one of its surfaces) or a material to be treated is exposed in, on or at a substrate or in a bath container in the Z-direction for the purpose of laser-assisted processing, either the bath container/substrate/body is usually moved in the X-Y-plane while the focusing optics are movable in the Z-direction, or the bath container/substrate/body is movable in the Z-direction while the focusing optics are moved in the X-Y-direction. As described above, rotation about one axis (Z-axis or X- or Y-axis) can be used for rotationally symmetrical structures. The case should be considered in which the processing is to begin directly on the bottom of the bath container or on the substrate or on the body. When irradiated with a low NA lens, e.g. one with a NA of 0.6, voxels with a length of a few μm (depending on the conditions, such as the focus positions in the material and the thickness and type of material, in the range from approx. 2 to even approx. several 10 μm) in the Z-direction and a much smaller extension (approx. 0.5 to approx. 5 μm) in the X- and Y-direction are produced depending on the performance. When using a high NA lens, for example with a NA of 1.4, the voxels can have a length in the Z-direction of approx. 200 to 500 nm, if necessary even up to approx. 800 nm, depending on the power; their extension in the X-Y-direction is approx. 100 to 300 nm, possibly even up to approx. 500 nm. The the intensity of the irradiation and thus the cross-linking density in the voxels increases from the outside to the inside. One obtains relatively homogeneous structures by setting pulse trains of preferably approx. 10 to 80 MHz or also with 1 to 10 kHz repetition rate, while substrate and/or focusing optics are moved in X-Y-plane and/or Z-direction or also in any other combination of movements in different planes, like for example X-Z or Y-Z, wherein this is to be seen only exemplarily and should not mean restriction on only these cases.

If the substrate or bath bottom or the body itself (or an existing structure on or in the body or a combination thereof) is flat or regularly curved, the structure being formed may dock to that substrate or bath bottom or to an existing structure on or in the body or to a combination of the foregoing setting. The same applies if the bath container/substrate/body of any shape is mounted on an axis of rotation.

However, if the substrate or the bath bottom or the surface of the body is not regular, unless special measures are taken, when the substrate or the focusing optics are moved in the X-Y direction, the focus of the laser beam either moves further upwards into a region of the material to be solidified, thereby forming solidified voxels that are not sufficiently supported by their surroundings, or the focus moves into the substrate itself, so that no further solidification is possible, or the focus is below or above the surface of the body. Some glasses and glass ceramics can also be treated with TPA/MPA. It is possible to trigger phase transitions (e.g. crystal formation) and/or redox reactions on the surface or inside of suitably pretreated materials. The solubility of the material, e.g. in HF, in $NH_4F$ or in mixtures thereof, can be changed, e.g. increased, in the processed areas by the processing. Here it is necessary to be able to precisely control the desired working area within the glass or the glass ceramic. Similarly, in or on any part of solid bodies of suitable materials (organic polymers or inorganic-organic hybrid polymers), TPA/MPA can be used to produce a chemical bond fracture in the material of the bodies as a result of which the solubility of this material increases compared to the untreated material. The more soluble material can be washed out if necessary ("positive resist"), or its other properties modified by the TPA/MPA are used for other purposes.

A similar problem arises with the surface treatment of metals and other materials: the laser radiation must be placed very precisely in the material or at the interface between materials or also at the interface between material and air, i.e. it is necessary that the energy input by the light beam falls exactly perpendicularly (or exactly at a predetermined angle) on the metal surface. If it is an object with an irregular surface, this cannot be achieved or only with considerable effort for the movement of the components.

As mentioned above, the expression TPA/MPA is used for two-photon and/or multiphoton polymerisation in accordance with the invention. While the absorption behavior of single-photon absorption is characterized by linearity with respect to photon density and can be explained by classical physics, the simultaneous absorption of two or more photons is explained by quantum mechanics. Here it can be shown that at very high peak intensities (photon densities) the probability of multi-photon transitions increases. There is a non-linear behavior towards the photon density, which makes the absorption profile narrower. Due to a threshold value process for the materials used, a reaction only takes place in an area in which the laser intensity exceeds this threshold value. Thus, the reaction can take place in a very narrow space, thus enabling the generation of highly accurate structures and does not take place outside the focal volume with sufficient intensity or with reduced efficiency, so that suitable intensity profiles can be produced by shaping the focal volume, which lead to different material properties in a single material and, if necessary, also in a single process step.

In the present invention, the expression "structure being formed" is to be understood as the product of laser treatment, in particular TPA or MPA or treatment with pulsed lasers such as ultra-short pulse lasers in general. This can be a solidified material, for example, if the TPA/MPA triggers a polymerisation reaction in an organic or organic-inorganic hybrid material, it can be a structure obtained by dissolving parts of a solid when the TPA/MPA triggers a bond break; it can also be a structure which has different physical properties than the material not exposed with TPA/MPA, e.g. a structure which has a different physical property than the material not exposed with TPA/MPA and which has a different physical property than the material exposed with TPA/MPA.B. is more soluble or less soluble, or any other structure formed directly or indirectly by site-selective irradiation using TPA or MPA.

A polymerization reaction may be triggered by TPA/MPA on organic or organically modified inorganic materials, such as organically modified polysiloxanes or mixtures thereof, which have organically polymerizable C=C double bonds or other light-induced polymerizable groups. These can be unfilled or filled with nanoparticles or microparticles. Alternatively, the TPA/MPA can trigger binding fracture processes, which allow solubility changes to be achieved to an adjustable extent. In addition, redox processes, restructuring processes and/or phase transitions, e.g. crystal formation in glasses and glass ceramics, can be induced by TPA/MPA and, using suitable devices, strongly localized and controlled in three dimensions.

Metallic surfaces, metallic bodies (e.g. with dimensions in the cm or dm range) or metallic films or structures on the aforementioned materials can be processed locally selectively using pulsed lasers, in particular ultra-short pulse lasers: Laser ablation, also called laser evaporation, is the removal of material from a surface by bombardment with pulsed (or cw) laser radiation. The laser radiation with high power density used here leads to rapid heating and the formation of a plasma on the surface. However, ultra-short pulse lasers can also be used to produce superficially site-selective melting or evaporation without plasma formation or to form alloys. It is therefore possible to use ultrashort pulse lasers to structure metals very finely or to change their surface composition very finely. Ultra-short pulse lasers, for example, can be used to produce extremely fine drill holes. These must be placed exactly in the material, i.e. it is necessary that the energy input by the light beam falls exactly vertically or at any precisely defined angle onto the metal surface. If it is an object with an irregular surface, this cannot be achieved or only with considerable effort for the movement of the components.

Metallic structures processed with pulsed lasers, especially ultrashort pulse lasers, should also be subsumed under the expression "forming structure" according to the invention.

Glasses can also be with the help of the invention, likewise

Furthermore, using polymers, metal can be applied to surfaces and materials of any shape using TPA/MPA and a metallization process: A substrate or body is coated with a polymer precursor and exposed with an ultra-short pulse laser to trigger a two- or multi-photon process. The solubility of the material in the exposed areas is increased compared to that in the unexposed areas, so that the material can be washed away from the exposed areas using a solvent or solvent mixture. This is followed by a surface-metallization by coating processes such as vapor deposition, sputtering, electrodeposition or (pulsed) electrodeposition and then a lift-off of the remaining coated polymer, wherein the metallization remains only at the points on the substrate or body where the polymer has been washed away. The structuring exposure step in this process is difficult to realize with irregularly shaped surfaces or bodies.

The present invention aims to eliminate this disadvantage and to provide a simple system with which even substrate-supported unformed materials (because they are usually not solid), materials in a container or bath (usually liquid or pasty) or substrate-supported or substrate-free bodies, as described above, can be processed with a very complex geometry using a laser-supported process, in particular with TPA/MPA or ultra-short pulse lasers. In other words, a device is to be provided which is suitable for processing a material adhering to a substrate or a substrate-associated or substrate-free body and/or its surface by treatment with a laser beam, in particular by TPA/MPA and/or by treatment with an ultrashort pulse laser. The expression "materials adhering to a substrate" should also include materials in a container or bath; the expression "substrate" should therefore include structures of any shape (flat or uneven, flat or curved, with or without other superstructures on top, with or without a non-solid material "(holding)" side structures/side walls).

According to the invention, it is proposed that the material or body for the required processing step(s) be stored on or at the sample holder of a positioning system having three translational and three rotational degrees of freedom. This makes it possible to adjust any inclination or tilting of the substrate relative to the focusing optics in such a way that the laser beam from the focusing optics always hits the substrate or body surface perpendicularly or, alternatively, if required at a desired, pre-settable angle.

The invention thus provides a device suitable for the laser-assisted processing of a material adhering to a substrate or of a substrate associated or free body or of its surface, in particular by TPA/MPA and/or by treatment with an ultrashort pulse laser, comprising:
  a positioning system (9, 10, 11) having three translational and three rotational degrees of freedom and having a sample holder, the sample holder being adapted to hold the substrate (7) to which the material to be processed adheres or to which the body to be processed is associated or, in the absence of a substrate, the body (7) to be processed,
  a laser source (1) capable of emitting laser pulses or laser pulse sequences, and
  a focusing optics (6) which is located above the sample holder or laterally (24) or below the substrate (7) or body (7) held by the sample holder and which can shape the laser pulses or laser pulse sequences in such a way that they are located in a focal point or an expanded focal volume (seen relative to a focal point) in the region of the material or body to be processed. body in such a way that a 2- or multiphoton polymerization can take place there, or in such a way that this polymerization takes place in a focal point or in a more extensive focal volume in the region of the body in such a way that material located in this focal point is subjected to the desired chemical and/or physical changes, e.g. is subjected to a bond breaking reaction, becomes liquid or vaporous and/or sublimates and/or is subjected to a phase transition and/or a redox process.

BRIEF DESCRIPTION OF THE SEVERAL VIEWS OF THE DRAWING

The attached figures explain the invention in more detail, wherein

FIG. 9 shows an eighth embodiment in which a substrate or body is supported on a rotatable axis, and FIG. 10 schematically shows the possibility of processing the material or the body using one or more focusing optics arranged on the side.

Figure 1:
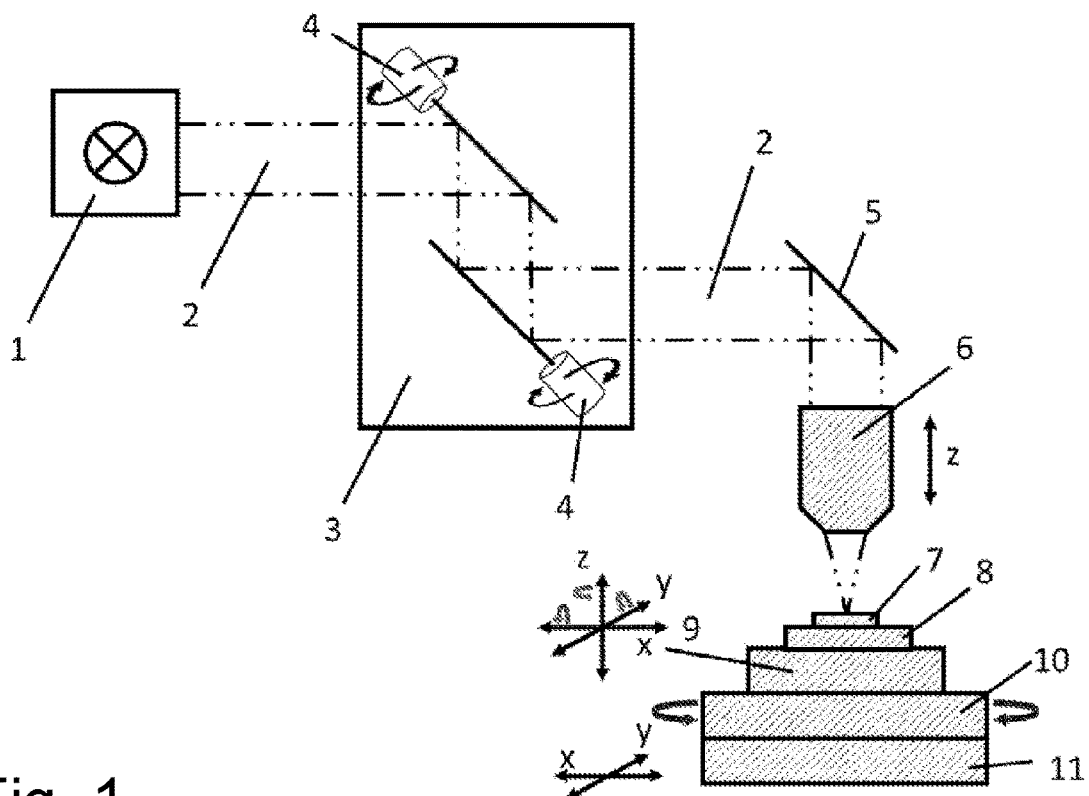
FIG. 1 gives an overview of the components of the device according to the invention.

A single or first carrier in the form of a device with up to six legs mounted on a first base, whose length and angles are variable and which are connected to a second base in a suitable arrangement (e.g. a hexapod) is used particularly preferred as the positioning system.

Hexapods are known from the prior art. They are characterized by the presence of three linear axes and three rotational axes, often arranged on very small surfaces, and have high dynamics. The dead weight and the fraction of mass that has to be moved are very small, so that they have a low inertia and can achieve high accelerations and final speeds, which makes them suitable for very fast processes with movements of any kind. All axes usually show (nearly) identical dynamic behavior, very low crosstalk of the axes and high stiffness. The advantage of hexapods lies above all in the free definition of the pivot point. Due to the mobility of the hexapod or comparable devices, structuring is also possible on curved surfaces, such as concave mirrors or other free-form surfaces.

In addition to said first carrier, the positioning system preferably comprises, in specific configurations, a second carrier capable of movement in the X-Y direction and/or in the Z axis and/or having an axis of rotation. This carrier is also referred to as positioning stage. It can be connected or attached to the first carrier in any way, for example by means of clamps, or the second carrier can be embedded in the first carrier and/or hold it by means of a suction vacuum.

In particular, the positioning system, which has three translational and three rotational degrees of freedom, can be synchronized with the pulsed laser source as an active process, so that the sample material can be processed in a controlled manner by variable laser pulse sequences, which can run along arbitrarily shaped 3D trajectories. Thus the sample is controlled and dynamically moved by the positioning system during the complete light exposure process. In addition, the positioning system can be controlled in such a way that, despite curved or uneven surfaces of the sample, the laser beam always falls perpendicularly onto the substrate through the focusing optics, as the sample can be aligned corresponding to the direction of the laser beam by means of the positioning system.

In an advantageous design, the control and regulation of the positioning system is based on a measurement of the position of the sample relative to the direction of the laser beam. In particular, it is proposed to integrate the principle of the light pointer method into the system in order to determine the position of the sample (with corresponding feedback loop for control). A light beam is reflected from the sample into a detector (such as a diode, preferably a four quadrant diode) or an array of detectors, from the substrate holder, a substrate (without components) and/or a substrate with components (can be a bare sample or an assembly) into the detector. The exact position of the substrate holder and the substrate is determined by alignment marks and the deflection of the light beam on the detector. A calibration to determine the reference position is carried out when the light falls vertically along the optical axis such that an incorrect adjustment can be taken into account. The individual detector surfaces are read mathematically and the deviations from the original position are determined in situ. A control with feedback loop moves the hexapod in all spatial directions in such a way that the fastest and shortest movement is always possible and the light always irradiates the sample to be processed in a perpendicular direction, regardless of its composition (shape, waviness, etc.).

In accordance with the invention, a second carrier, if present, is used as the second carrier, which enables linear positioning in the planes of the space and/or positioning about at least one rotatable axis (e.g. mountable on the X-Y positioning stages, e.g. a positioning table or another positioning stage not necessarily designed as a table). This could be, for example, a carrier in which a rotation axis is mounted on a positioning unit that can be moved in the X-Y direction. The positioning unit can perform movements in the X and Y directions, and the rotation axis can perform a rotary movement, wherein the length of the rotation axis in the Z direction is preferably variable, e.g. by extending and retracting the rod, so that the height of the first carrier can be adjusted by the second carrier. The second carrier can also be made up of several partial carriers (partial positioning stages). Irrespective of whether it represents a single positioning stage or is made up of several subunits, the second carrier can be mounted in any position, e.g. air cushioned, and be driven in any way, e.g. mechanically and/or piezoelectrically.

If there is a second carrier, it can serve as the base of the device, for example if it is a linearly movable table or an axis rotating in the Z direction. In these cases, the first carrier is arranged on the second carrier. However, it is not mandatory that the first carrier is attached to the second carrier. Depending on requirements, the second carrier can instead be arranged on the first carrier, or both carriers can be arranged side by side, with the sample holder usually located at one side end of the carrier construction.

The expression "sample holder" of the positioning system shall mean an area of the system on or to which the substrate or body may be supported or attached. It may, but does not have to, be a flat surface. The surface may also have apertures, or the sample holder may be formed of or include a rod construction or the like. Preferably, the sample holder is part of the first carrier, e.g. the hexapod, especially in the form of its second base. The sample holder can also be connected to the first or the second carrier in any way, e.g. by screws.

The expresion 'focusing optics' is defined according to the invention as a focusing device, preferably a lens or lens system, which may be housed in a housing and have additional components.

Each focusing optics may be movable relative to other elements of the beam guide and/or the material container and/or the material to be solidified and/or the carrier unit, so that only the focusing optics need to be moved for positioning and remaining elements of the beam guide may be permanently installed. Particularly in the case of positioning via a movement of the optics, the laser beam can be guided with particular advantage at least in partial areas of the beam guidance via optical waveguides.

To avoid imaging errors upon focusing, hybrid optics consisting of diffractive optical elements and conventional lenses can be used according to the the invention. The diffractive optical elements are made of quartz glass, organopolysiloxane-containing materials, liquids or any combination of materials, for example in layer systems or structured layers. They can be optically initiated by electrical potentials, magnetic signals or surface tensions that can be variably adjusted, for example by molecular layers that change their orientation by applying a voltage in such a way that the polarity of the surface can be changed in a controlled manner. When using focusing optics, which are used without refractive index adjustment, variable penetration depths of the light into the material result in a positioning error due to refraction at the air-material interface (i.e. the movement of the focal volume does not correspond to the movement of the optics). This deviation in the Z-positioning of the focal volume can be compensated by a correction factor, e.g. a factor implemented in the machine software, or, if necessary, by a correction wheel on the focusing optics, which makes it possible to minimize the imaging errors/aberrations to the desired working position.

The device and the method of the present invention are advantageously not limited by diffraction limitations of the focusing optics, because on the one hand there is a different absorption behaviour than with linear single-photon absorption and on the other hand a threshold value process is exploited. The absorption profile (approximately Gaussian or Lorenz profile) for multiphoton absorption is still narrower, allowing better resolution because there is a non-linear relationship between photon density and absorption behavior.

Figure 5A:
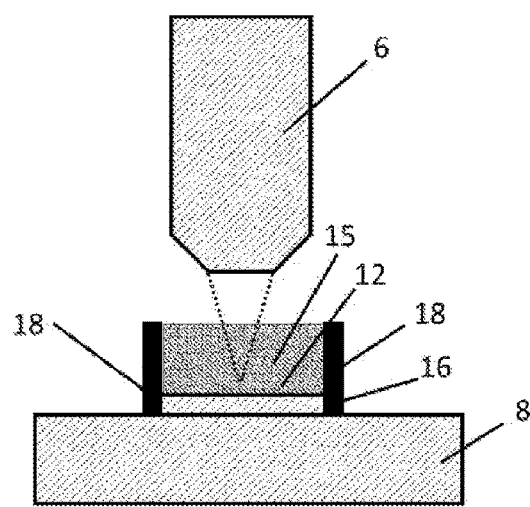
FIG. 5 shows a fourth embodiment in which a material to be solidified is arranged in a container and the focusing optics is aligned such that the laser light is irradiated into the container from above (FIG. 5a) and from below (FIG. 5b) respectively.
Figure 5B:
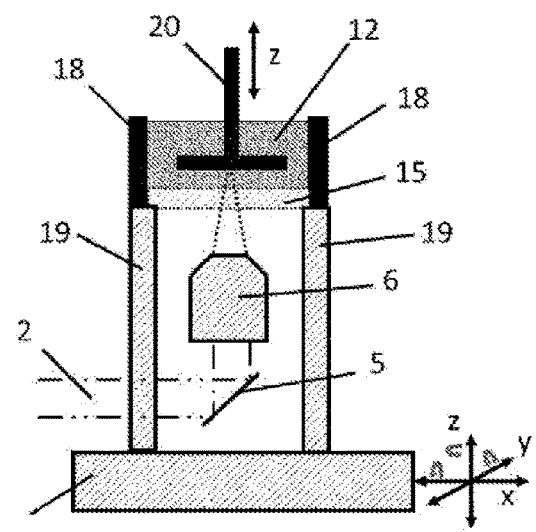

In a large part of the embodiments of the invention, the focusing optics are located above the material or body to be processed and thus also above the sample holder. However, it can also be arranged below the material or body to be processed or laterally to it, as shown as an example in FIG. 10. When below, the sample holder may include a carrier structure for the substrate or body which provides internal space for the focusing optics and whose construction allows a lateral connection to the associated optical lines, as shown in FIG. 5b), wherein the carrier structure consists of mountings 19. The carrier structure may serve as a carrier for the substrate or body or may itself have a support surface therefor, a substrate being transparent for the light wavelength used if it is located between the focusing optics and the material to be processed or the body to be processed.

The focusing optics can be an air lens. The latter can be dense compared to the material to be processed, so that it can dip into the latter in such a way that a direct boundary surface between objective and material is formed. Alternatively, an (oil-) immersion lens can be used, the cover glass of which can be used as a substrate, for example. Alternatively, the transparent carrier surface is used as 'cover glass' and focused into the material above the support surface.

The combination of the innovative positioning system with translational and rotational degrees of freedom with a focusing optics designed for immersion in the material to be processed offers special advantages. This is because the focusing optics can be moved along a substrate that is completely immersed in the material to be processed and of any shape in such a way that the radiation is focused precisely and perpendicular to the surface at the desired anchor points. The orientation of the material surface then becomes irrelevant. For sufficiently small structures, patterning may also be performed in a droplet of the material which, under appropriate surface tension and adhesion conditions, may also adhere to substrate surfaces which are inclined in relation to the horizontal orientation or which are oriented downward so that the droplet hangs on the substrate surface. When structuring in a droplet, the bath container can be omitted. The device according to the invention thus has a positioning system with which the laser focus or the laser focus can always be positioned vertically or at a desired angle to the substrate surface or to the virtual or actual surface to be processed. It can be arbitrarily shaped, for example flat, or have a regular or irregular curvature and/or contain different components, such as edge emitters, photonic integrated circuits and/or other passive and active elements, including microfluidic elements and/or also electronic components and/or any combinations thereof, which is not restrictive, but exemplary, as any arrangement of components and/or components with any function (such as optical, photonic, electrical, electronic, magnetic, piezoelectric, etc.) can be processed. The positioning is carried out by moving the device described above (first carrier together with second carrier or alone) with sample holder, possibly supplemented by a movement of the focusing optics, which, however, is not mandatory. It can take the form of linear and/or rotary positioning in and/or around one, two, three or more axes. In particular, due to the characteristics of the positioning system and especially when using a first carrier as defined above, any inclination angle and/or surface geometry and/or surface morphology and/or surface topology and/or arrangement are possible.

For a better general understanding of the invention, a schematic representation of a specific design of the device according to the invention is given in FIG. 1. The non-focused beam (2) of a laser source (1) is guided via a galvano scanner system with rotatable deflecting mirrors (4) onto a deflecting mirror (5), which introduces the light into the focusing optics (6). This focusing optics can be moved in the Z-direction. The beam emerging from the focusing optics is focused on a suitable point or area of the material to be processed (7), which is located on the sample holder, here the surface of a chuck (8). This is located on a first carrier (9), which may be a hexapod, and this in turn is in turn located on a second carrier, which is constructed here from a component (10) rotatable about the axis Z and a component (11) displaceable in the X-Y plane (it should be clear that in FIG. 1, for reasons of clarity, many of the possible components are shown in a specific arrangement. Of course, this does not mean that all these components must be present. For static reasons it in relation to one another, is better to mount the substrate directly on the hexapod, if this is possible).

If the substrate or body is "directly" placed on the sample holder of the device with the degrees of freedom, it is arranged directly on this sample holder. If a hexapod is used, for example, as mentioned above, its second base usually serves as the sample holder. Alternatively, there may be a holder for the substrate or the body on the sample holder. In this and similar cases, the substrate/body in the sense of the invention is "indirectly" arranged on the sample holder. In any case, it should be clear that the sample holder need not be a continuous surface; instead, the sample holder may have recesses or the like or may be in the form of a frame or have another shape as mentioned above. It does not necessarily have to be flat, but can e.g. be curved or otherwise adapted to the requirements of a specific substrate or body.

If the substrate or body is "indirectly" positioned on the sample holder of the device, the substrate or metal body can be fixed on the sample holder by means of an air extraction system. Such an air extraction is known in the field of wafer processing under the name "wafer chuck". The expression 'chuck' is therefore intended to characterise this type of carrier in what follows. The chuck according to the invention has the form of a hollow body, the upper side of which is designed as a perforated plate with or without grooves for supporting the substrate or body and which has a suction opening for controllable air suction. This suction opening can be of any design, e.g. in the form of the entire bottom surface or in the form of an opening with or without a valve and in varying sizes and shapes. This allows the substrate or the body to be fixed by suction forces (vacuum).

In a special version of the invention, the perforated plate of the chuck is designed to be removable and the rest of the hollow body is designed in such a way that its upper side can be closed by perforated plates of different sizes and/or shapes, so that substrates or bodies of any shape can be accommodated, such as wafer-shaped substrates, microscopy glasses, assembled or unassembled printed circuit boards, electrical or electrical/optical (micro)components which have not yet been encapsulated or packaged electro-optical or optical components with or without glass fibres, or Fiber optic arrays, wherein this list is only exemplary and not restrictive.

In an alternative design, which can also be used cumulatively with the previous one, the chuck is divided into several areas whose air extraction can be controlled separately. The control can, for example, be carried out using valves. Substrates or bodies of different shape and size can be held on such a chuck. For example, the chuck may have an inner area in contact with the central holes of the hole plate to fix small bodies or substrates, and around that area one or more ring-like and/or stripe-shaped areas which may be used in addition to the suction if the bodies or substrates are larger. The vacuum in the individual areas can be selected differently and the areas can also be activated and deactivated separately. It can be advantageous to build up a stronger vacuum in rings further outside in order to keep even large substrates or bodies stable.

In the event that the device according to the invention uses a substrate which is not completely flat on its backside, as may occur, for example, with an assembled printed circuit board or an electrical or optical or electro-optical component, an additional carrier may be provided on the chuck. This carrier can be a flexible or non-flexible, fixed carrier, designed to still allow the substrate to be aspirated by the chuck. It should have such a tightness and any number of holes and grooves that an arbitrarily shaped and arbitrarily large hole pattern of the chuck can hold any sample in the vacuum. This can be a rigid or flexible overlay, such as a rubberised overlay (mat) or a silicone mat, into which small holes and/or grooves are preferably formed. Flexible mats are inexpensive for holding uneven bodies or substrates on the underside, such as electrical or (electro)optical components, which often have solder balls or the like on their backside. Such unevenness can be absorbed by a flexible mat into which they are pressed.

The Chuck serves as a variably designed or configurable sample holder; if required, however, it can also be designed and used for equalization and compensation of a wedge error. The use of wedge error compensation is known to the skilled person from the prior art.

Any structure that can hold at least a very small amount of machinable material, e.g. a drop thereof or a very thin layer thereof, or the body to be processed, can serve as a substrate. The substrate may, but only in some cases, such as the one described above, be translucent, e.g. made of glass. Instead, of course, other materials are suitable as substrates, e.g. metals. In order to demonstrate the diversity and variability of the substrates that can be used, some examples are given below, which should not be understood as restrictive under any circumstances.

Figure 2:
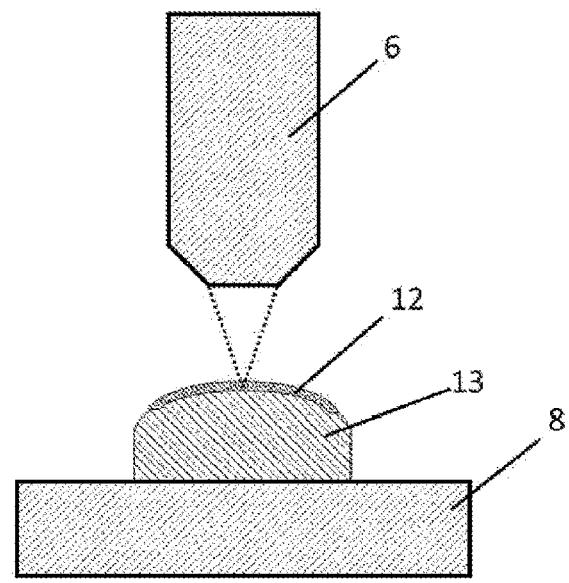
FIG. 2 shows a first embodiment of the invention in which a material located on a substrate (here e.g. a lens) can be processed using a focusing optics located above it.

In a first embodiment it is e.g. a flat substrate without side walls. This substrate can be covered with a layer of material to be processed, e.g. to be solidified, which is to be structurally solidified or otherwise processed and left on the substrate using the method according to the invention. The invention is therefore suitable for the modification of surfaces, for example. For example, the substrate may be a lens or a concave mirror, or a body or vessel with studs or other predetermined structures. FIG. 2 shows a design that is suitable for illustrating this embodiment. In this figure, the positioning system comprises a chuck (8), the surface of which represents the sample holder and on which the substrate rests. For example, the substrate may be a lens with a layer (12) of material to be solidified or otherwise processed thereon.

Alternatively, a small amount, e.g. a drop, or a liquid or pasty layer can be applied to the substrate, in which processing takes place from the substrate surface, e.g. solidification of a three-dimensional structure, which is subsequently freed from unsolidified surrounding material, i.e. "developed". In such cases, the substrate may be covered with a sacrificial layer or a layer on which the solidified material adheres only weakly in order to detach it from the substrate. In such a drop or in such a layer, a three-dimensional structure can also be formed using suitable solidifiable materials, which becomes more soluble than the area not affected by the 2- or multi-photon polymerization by a subsequent treatment. In this configuration, the cover glass of an oil immersion lens can be used as a substrate.

If a small amount of material to be solidified is used, the meniscus properties and thus the external shape of the material adhering to each other by cohesion can be controlled by surface modification and functionalization of the surfaces to adjust the interfacial energies. For this purpose, the material properties can be adjusted, e.g. by introducing hydrophobic or hydrophilic groups into the polymerizable material.

Figure 3:
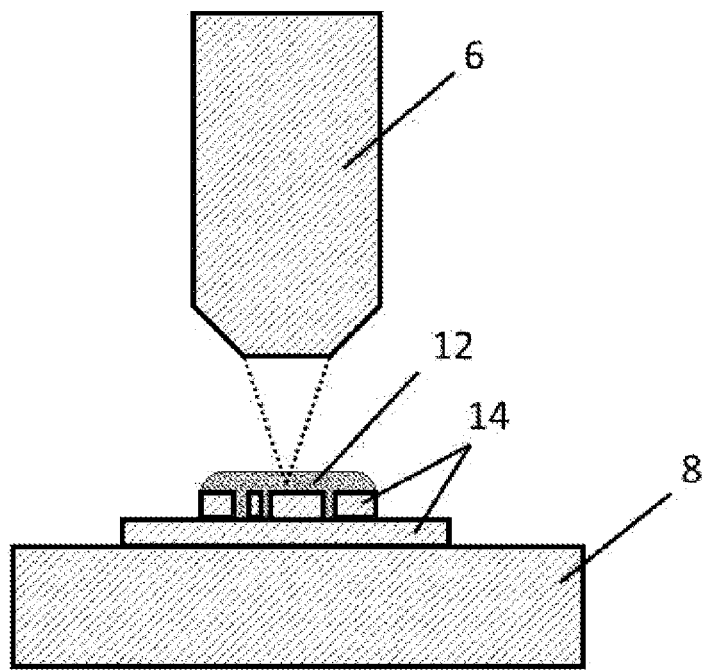
FIG. 3 shows a second embodiment of the invention in which the substrate is equipped with components and the material to be processed lies between and above the components.

In a second embodiment, the substrate is a manufacturing component, such as an optical or optoelectronic component or a photonic chip or a photonic integrated circuit (PIC), or a (partially) assembled or unassembled printed circuit board, or generally a component with active and/or passive components, such as actuators, sensors or mirrors, or other components, such as glass fibers or glass fiber ribbons. If the components are small enough or their distance from each other in the component is small enough, a single drop of material to be processed, especially to be solidified, is often sufficient, which can be applied to a surface or into a cavity (if available) of the component. However, any prior art coating process can be used likewise, with or without external limitation of the area to be coated. Using the method according to the invention, one or more preferably optical components are then structured for this component, selected e.g. from waveguides, collimators, microlenses, gratings, diffractive optical elements, combinations of refractive and diffractive elements and phase elements, which are formed directly on the bottom of the component or on a structure already present in the component. The solidifiable material can be selected such that the component structured in accordance with the invention is either freed of residual material after structuring and/or that the entire solidifiable material is pre-crosslinked beforehand by light and/or heat treatment and/or that the entire solidifiable material is completely pre-crosslinked measured against its possible maximum conversion of the crosslinkable chemical groups and/or that the entire solidifiable material is subsequently post-consolidated by heat or floodlight. As is known from the prior art, in such cases the component structured by TPA/MPA has a different secondary or tertiary structure so that it differs physically (e.g. by its refractive index and/or its mechanical and/or chemical and/or dielectric and/or magnetic properties) from the environment hardened by heat or floodlight. The second embodiment is illustrated in FIG. 3, where both the component and the components or parts located on it (i.e. the entire so-called assembly) are marked with the reference number (14).

In a specific version of this embodiment, a waveguide is structured and then freed ("developed") from the surrounding material, whereupon a material different from this material (solid, liquid or gaseous) is introduced, which serves as cladding and whose refractive index is preferably chosen so that the refractive index difference between the waveguide and the cladding is higher than that between the waveguide and the material from which it was structured. In this way, high NA can be produced while at the same time exploiting the 3D capability.

Figure 4:
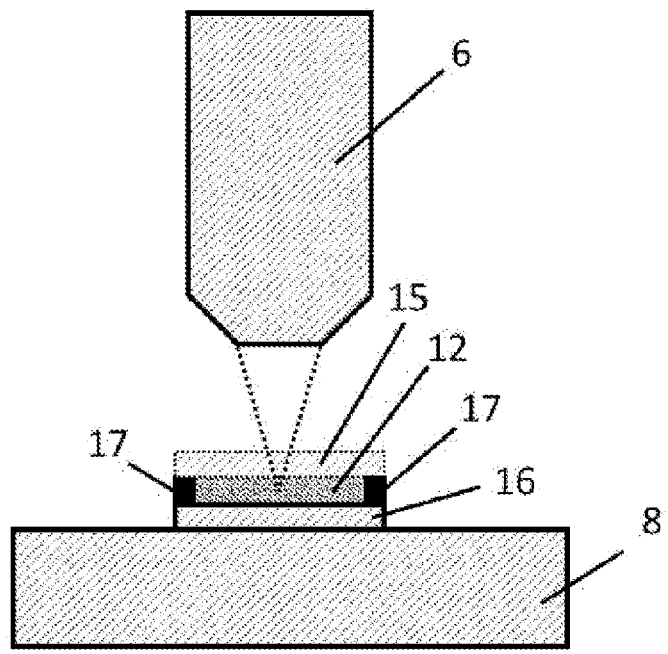
FIG. 4 shows a third embodiment of the invention in which the material to be processed is located between two substrates, which are optionally kept spaced apart by spacers.

In a third embodiment, solidifiable material or material whose bonds can be broken by the TPA/MPA process is arranged between two substrates, of which the substrate arranged on the sample holder can be of any nature, e.g. as explained in the first two embodiments, while the second substrate must be translucent. The irradiation can be carried out from above or below or from both sides, wherein two transparent substrates or carriers of course available for irradiation from below and above. FIG. 4 shows a design that can be read on this embodiment. The material (12) to be processed is arranged between two substrates (15, 16), the upper of which must be translucent. Spacers (17) to be optionally provided ensure an even and possibly constant distance between the substrates. Of course, alternative processes with such a structure can be carried out, for example polymerisation reactions in a (e.g. liquid) material between the two substrates.

In a fourth embodiment, a relatively large body is created using 2PP structuring. For this purpose, the substrate can be designed as a material container for a bath of solidifiable material, as shown for example in the above-mentioned WO 2011/141521 A1, or the material can be held as a meniscus between an arbitrarily shaped substrate and a focusing lens, such as a microscope objective. The shape of the meniscus can be further improved by incorporating appropriate surface functionalities into the material used. This is achieved, for example, by modifying the hydrophobic/hydrophilic material properties described above. To ensure that there is always a sufficient amount of material to be exposed between the focusing optics and the substrate, as might be necessary, for example, for the production of large structures, the material can be supplied by a dispenser, e.g. with a (micro)pump and/or a microfluidic element. Two different versions of this embodiment are shown in FIGS. 5a and 5b. While the material (12) in the first of these configurations is exposed from above, the exposure in the second configuration takes place from below, namely through the transparent bottom (15) of the material container (15, 18) (which functions here as substrate), a carrier being present in the bath to which the structure to be solidified can couple. Of course, a carrier can also be used when exposure is from above. If required, the focusing optics can be tightly positioned opposite the material and immerse in the bath.

Figure 6:
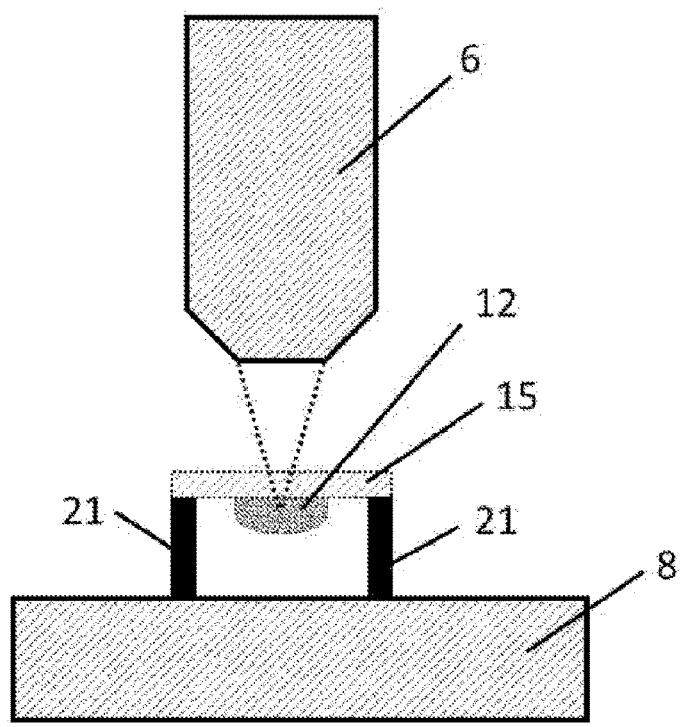
FIG. 6 shows a fifth embodiment in which a material to be solidified hangs on a substrate and is irradiated through the substrate.

In a fifth embodiment, the substrate is attached to spacers which are located on the sample holder or the chuck or similar in such a way that a space is formed between the substrate and the holder, on which, for example, a drop of material to be solidified hangs, which is controlled by the light radiation through the substrate using the laser and the focusing optics. A three-dimensional structure can be formed in this drop, as described above for the first embodiment. Here, too, the shape of the drop can be influenced as described above. This embodiment can also be used for positive resists. The structures are written into a coating on the substrate by breaking the bond. Afterwards a metallization can be developed and applied and the unexposed material can be removed by a lift-off. The embodiment is shown in FIG. 6, wherein spacers (21) are mounted on a chuck (8) and support the substrate (15) to which a drop (12) of the material to be patterned hangs.

Figure 7:
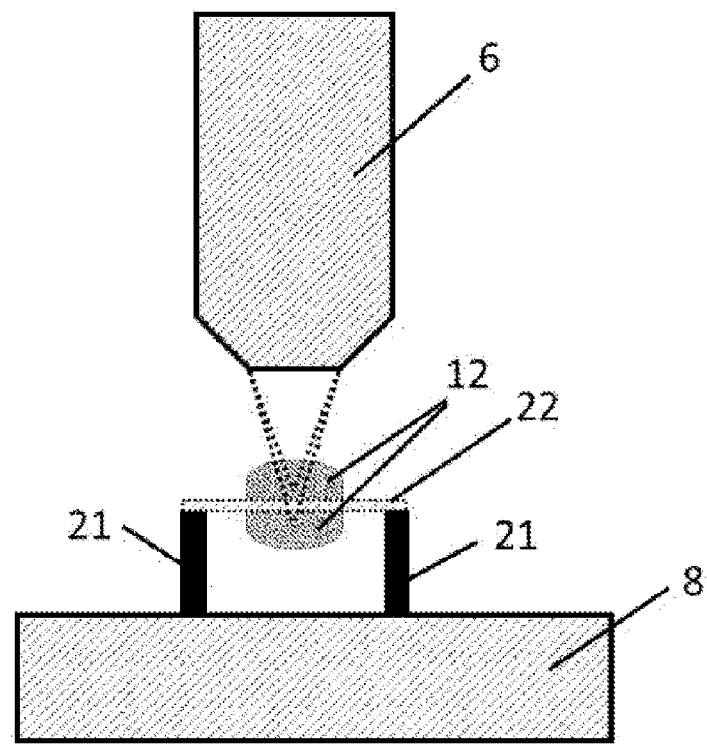
FIG. 7 shows a sixth embodiment in which a thin, transparent substrate is coated with material on both sides, wherein the irradiation conditions are selected so that both sides are processed simultaneously or consecutively.

In a sixth embodiment, the substrate comprises a translucent area which is provided on both sides with material to be processed, in particular to be solidified. If this area is sufficiently thin, a suitable choice of focusing optics (e.g. a low NA) can cause simultaneous solidification of the areas on both sides of the surfaces of the translucent area, since, as mentioned above, voxels with lengths of up to approx. 100 µm or even more can be solidified for very low NA and small magnifications if the centre of the voxels lies within the translucent area. In this way, suitable materials can be used, e.g. thin glasses or glass ceramics or other transparent materials, if necessary also in the form of tubes, which can be coated on both sides. For this purpose, a holder can be used which allows the substrate to be coated on both sides with the liquid or pasty material without contaminating the device. When using lenses with very high NA, nanostructures below 100 nm on both sides of a thin, transparent substrate of any shape can be achieved, provided that the material is at intensities within the FWHM (Full Width Half Maximum) or slightly below when crosslinked. FIG. 7 shows this embodiment, which in the special case has the characteristics of the fifth embodiment, i.e. spacer (21) on a chuck (8). It can be seen that the material to be solidified (12)—here in the form of a drop—is located on the very thin, transparent substrate (22), which can be a vessel or a tube. Of course, the exposure can be carried out instead or additionally with a focusing optics on the underside, or the exposure may be carried out (only or additionally) from the side. This allows a smaller amount of material to be exposed when focusing into the transparent substrate, since the voxel is smaller in the X-Y direction than in the Z direction.

Figure 8:
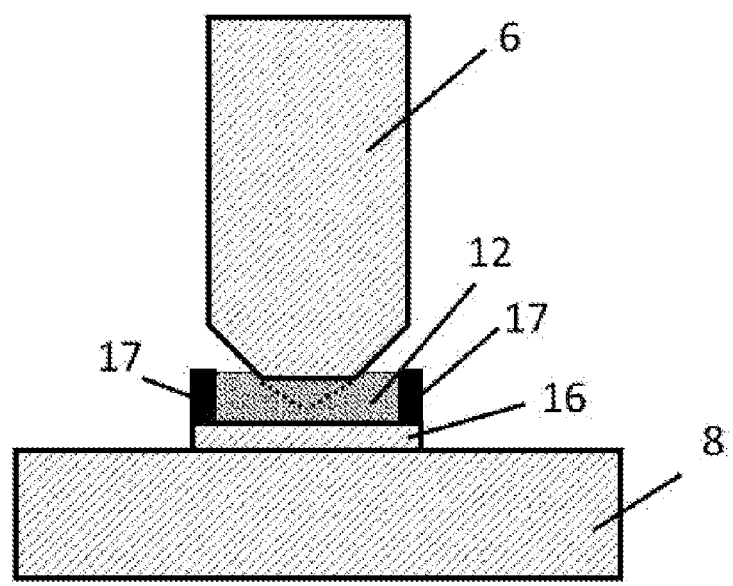
FIG. 8 shows a seventh embodiment in which the focusing optics is designed as an immersion optic and is immersed in the material to be solidified which is in a container.

In a seventh embodiment, the focusing optics dip into the material to be solidified on the substrate, as described for the second design of WO 2011/141521 A1, wherein the substrate can, however, have any shape other than that described in WO 2011/141521 A1, e.g. a shape as in one of the embodiments one, two and six. FIG. 8 shows an arrangement with liquid or pasty material (12) which is located on a substrate (16) and can optionally be held by walls (17).

The substrate can, of course, be arranged on the supporting surface in any orientation, e.g. diagonally, in all the above-mentioned embodiments; a preferred direction in e.g. X, Y or Z is not required.

In an eighth embodiment, the substrate can be rotated about an X-axis, e.g. above a material bath into which it can be immersed. It is supported by the X-axis, which is coupled to a sample holder of a device that can perform three translational and three rotational movements. This may be the first carrier of the invention. The rotation is initiated by the laterally mounted carrier. This embodiment is shown in FIGS. 9*a* and 9*b*, where in FIG. 9*b* the focusing optics are immersed in the material to be solidified. This design can also be used to process a thin substrate on both sides.

In a ninth embodiment, FIG. 10 shows by way of example that the focusing optics can also be attached laterally and thus structure the material. In addition, it can be structured from above and/or below.

Depending on the optics and material used, structural units (voxels) of less than 100 nm up to 100 µm can be produced in a material to be solidified, as mentioned above. By adjusting the laser intensity and the threshold process, infinitesimally small volume elements can be created in theory. By combining refractive and diffractive optics, the optical path of the laser pulses through the optics or the light path through the optics can be kept short and imaging errors can be reduced. Conversely, for certain structuring tasks, mapping errors can also be introduced in the course of structuring. The generated voxels can more or less overlap (besides the classical voxel-to-voxel approach, the process can work by moving the focal volume in three spatial directions with the first carrier and by using the first carrier of possible arbitrary tilt/shape under a kind of "continuous pulse mode"). If the light-matter interaction is well understood, the cross-linking result or a comparable result can be very well influenced in other than cross-linking reactions and form in its entirety the one- to three-dimensional structure to be produced. Depending on the size of the voxels produced, it is possible to provide the structure with a porosity that can be scaled at will. This is particularly important for the generation of scaffold structures to stimulate cell growth ("scaffolds"). Such scaffold structures can advantageously have a pore structure in the range from 10 nm to 10 mm, preferably from 1 µm to 5 mm, wherein a porosity on nanometer scale (0.5 to 10 nm) can be adjusted by the light-matter interaction for differently crosslinking materials, such as mixtures of acrylates with (meth)acrylates, epoxides with (meth)acrylates, styrene with (meth)acrylates and/or epoxides. Porosity can also be influenced by the addition of solvents or (functionalised) nanoparticles or microparticles. Likewise, all embodiments can be mixed with materials containing norbon groups in any proportions, using three types of mixtures: (1) those which are physically mixed; (2) those which are prepared at the molecular level by chemical synthesis with different groups which may be bound, for example, covalently and/or by hydrogen bonds and/or by van der Waals bonds; (3) those which are prepared by physical mixing of materials of (1) and (2). In the process, suitably modified nanoparticles or mixtures of nanoparticles and microparticles can also be introduced, as described in WO 2012/097836 A1.

Structuring exposure of an already (partially or even completely) solidified material with TPA/MPA or (partially or completely) solidification of a structured material exposed with TPA/MPA can in turn be used to create areas with different chemical and/or physical properties, e.g. different secondary or tertiary structure, in one and the same body from one and the same material, wherein these different physical properties, can be e.g. a varying refractive index or varying mechanical properties, can be. It is irrelevant whether the chemical functionalities are chemically bound, for example covalently, or whether the mixture is physically produced.

When laser radiation is introduced through a (possibly) second, translucent substrate, it is particularly advantageous that there is no contact between the optics and the material to be solidified. This enables rapid movement and positioning of the optics. No turbulence is generated in the material and there is less resistance compared with positioning a submerged optic. Furthermore, the optics need not be sealed against the material to be solidified.

If metals are to be structured or if the development of vapours or gases is to be feared in another process which can be used according to the invention, a structure is preferably used which protects the optics from harmful repositioning from the process by, for example, placing a glass in front of the objective, housing the entire optics and/or also introducing a gas stream of a carrier gas, such as dry nitrogen or dry argon or dry compressed air or mixtures of different gases, into the processing volume in order to remove substances arising from the process in the reaction area by, for example, suction. Since there is no contact between the optics and the material to be solidified, aggressive materials that would damage the optics can also be processed.

In the case of a focusing optics that can be immersed in the material, this itself forms a defined optical interface for the laser beam entering the material to be solidified. In contrast to the aforementioned version, the solidification can take place at any point in the material to be solidified, without the need for an additional positionable carrier unit, since the optics can be positioned within the material in the desired manner, can be immersed almost at any depth and the location of the solidification is not limited by the working distance of the optics.

It is clear from the above explanations that the device according to the invention can be used as described in its various forms and claimed below in all laser-assisted processes in which a material adhering to a substrate or a substrate associated or free body or its surface is to be processed, the laser-assisted process being, in particular, one which can carry out TPA/MPA and/or in which a pulsed laser treatment takes place. Some such procedures ("more specific procedures") will be explained in more detail below with reference to the figures. The device according to the invention can be used in any of the mentioned designs, unless specific arrangements of the device are explicitly mentioned.

Among other things, these methods include those for modifying a surface of a substrate (13) comprising a liquid or solid material (12) to be processed or for processing a drop or a liquid or pasty layer (12) on or on a substrate (14), the substrate resting on or attached to the sample holder of a device according to the invention. In this embodiment of the process, the substrate may be an object which can be used in optics, preferably a lens or a concave mirror, or a body or vessel or hollow body with predetermined structures, or an optical, electrical or optoelectrical component or component. For example, a drop of material (12) to be processed can adhere to a substrate (15) and be exposed in a structured manner by means of the focusing optics, wherein when the drop is below the substrate, the exposure is either through the substrate, the substrate being transparent for the radiation of the laser source, or wherein the focusing optics can be in direct contact with the material to be processed.

Further methods are those for processing a negative resist, a positive resist, an e-beam resist (e.g. of PMMA) (12) and the like, which is arranged between two substrates, wherein one of these substrates rests on or is attached to the sample holder of a device according to the invention and the other, through which focusing is performed, is transparent or opaque.

Further methods are directed towards the production of a body within a bath container with liquid or pasty, solidifiable material, wherein the bath container is arranged (rests) on the sample holder of a device according to the invention, in which the focusing optics (6) are located above the sample holder in such a way that it is located above the substrate (7) or body (7) held by the sample holder in the course of the operation of the device, or wherein the body is solidified from a carrier located within the material, said carrier being attached to the sample holder of a device arranged rotatably about an axis arranged in a plane, said axis being laterally coupled to a component of the positioning system and preferably laterally displaceable in a direction forming a right angle with said axis, said carrier being preferably immersed into the solidifiable material in the course of the process.

Further procedures are based on the processing of a body (a three-dimensional body, but also e.g. of a foil) or a liquid or pasty material, which is located in a bath container with side walls (18) or on or on or under a substrate (15) of any shape, wherein the body or the bath container or the substrate is located on or at the sample holder of a device according to the invention and the focusing optics (6) is located below the substrate (7) or body (7) held by the sample holder during the process, wherein the sample holder consists of or comprises a mounting (19) enabling a position of the material or body to be processed spaced from the positioning system (9, 10, 11) and having free space to receive the focus optics.

Further methods are aimed at processing a material adhering to a substrate, wherein the material is located in a meniscus between the focusing optics of a device according to the invention located below the sample holder and the substrate, wherein the substrate rests on, is attached to or adheres to the sample holder.

Further methods are directed at the processing of an at least partially thin-walled, translucent body, wherein the body is so directed at or on the sample holder of an device according to the invention, in which the focusing optics (6) are preferably located above the sample holder, such that surfaces on both sides of the thin wall of the body can be processed simultaneously.

Further processes are aimed at processing a glass or metallic body or a body comprising metallic or glass components using a device according to the invention, wherein the body either rests directly on or is attached to the sample holder or wherein the body is on a substrate attached to or on the sample holder. Of course, this body can also be three-dimensional or foil-shaped.

As can be seen from the above explanations, the material to be processed can be a material to be solidified in a number of designs. A material to be solidified in the sense of the invention is an organic material or an inorganic-organic hybrid material, in particular an organopolysiloxane-containing material which can be solidified photochemically in each case. The material to be solidified can be, in particular, a material filled with nanoparticles or microparticles or an unfilled material. Filled materials may have certain unbound additive materials that can give the material certain desired properties, such as optical, electro-optical, electrical, mechanical and/or magnetic properties.

The material to be solidified is often processed solvent-free and preferably low-solvent (e.g. with only a few, usually 1-3 wt. % solvents, which are difficult or impossible to remove from an inorganic-organic material after its manufacture). If no solvent is used, the materials may in some cases have a very high viscosity depending on their chemical structure. However, many materials that can be solidified with TPA/MPA are liquid or pasty even without solvents. Working with a solvent-free material has a number of advantages. Thus, the structures produced with it do not usually contain any small molecule, possibly toxic or otherwise questionable compounds.

If the fully solidified moulded body is to be separated from the substrate (negative-resist process), the latter may be functionalised in a known manner (by monomolecular or thicker layers) in such a way that detachment during the development process is possible using a solvent or by "lifting" the structure by means of tweezers or other specially arranged device (e.g. a knife). A sacrificial layer can also be applied to the substrate, on which the solidified moulded body adheres well, but dissolves in the development process (the removal of adhering bath material), so that the structure produced stands out from the substrate.

Alternatively, TPA/MPA can be used to dissolve chemical bonds in a material to be processed and then wash out the areas made more soluble as a result (positive-resist process). This material is preferably solid and then exists in the form of a body.

If glasses or glass-ceramics or other transparent bodies are to be processed with the device in accordance with the invention, redox processes or restructuring processes are triggered by the TPA/MPA in the focus area, for example, which cause a change in the solubility of the glass or the glass-ceramic or other transparent body. The more soluble components can then be washed out or etched, in the case of glass/glass ceramics for example with HF, $NH_4F$ or mixtures thereof.

For the processing of metals, metallic or metal-coated shaped bodies or metallic surfaces on a non-metallic substrate are used. In the focal range of the short pulse laser, metal is liquefied, vaporized or sublimated.

In one design form, a device according to the invention has an optical system for spatially dividing the laser beam and generating at least two or more spatially separated laser foci or intensity maxima, which is hereinafter referred to as parallelization. This allows the beam energy of the laser to be spatially directed simultaneously to two or more voxels, so that solidification occurs simultaneously at two or more locations. Relatively large structures and shaped bodies can thus be produced in a short time. If n voxels are produced simultaneously, the production time of the structures to be produced can be accelerated by a factor of n, depending on the element to be produced. This factor n corresponds at least to the number of intensity maxima or laser foci generated by beam splitting that cause multiphoton polymerization.

By means of parallelization, the invention enables not only a parallel generation of voxels of a single functional element, but also a parallel generation of two or more functional elements. (By "functional element" we mean any functional structure, i.e. an element that has any kind of (optical or other) function. A very simple example is a microlens.) A single structure can be created simultaneously using multiple focal points or multiple structures can be created simultaneously using one or more focal points. One or more optics can be used to create n foci. It is possible to produce several structures on the same substrate or to select a separate substrate for each structure.

Parallelisation can also be achieved by beam shaping or splitting a laser beam into several partial beams, which are then each focused and simultaneously solidify voxels at several points in the material. For this purpose, an amplitude mask can be used, which is brought into the beam path and generates a diffraction pattern in the far field of the beam. In addition, a microlens array, an Axikon lens, for example, for generating a ring-shaped focal plane or an electrically controllable spatial light modulator can be used as a dynamically variable phase mask, which effects a targeted distribution of the light intensity into several focal points and thus a partial parallelisation of the structuring process. In addition, the focal points can be moved in space by targeted dynamic modulation of the phase, which eliminates the need for mechanical displacement units.

In another version, the parallel production of the structures is generated by DLP (Digital Light Processing), a state-of-the-art projection technology. In this technique, images are generated by modulating a digital image onto a beam of light. Thus, it is also possible to simultaneously produce either the same structures in parallel or different structures by a variable control of the micro mirrors very quickly, precisely and above all simultaneously.

With the device according to the invention, the laser beam can be divided or spatially shaped in different ways. It can be achieved by using passive elements such as DOE's (Diffractive Optical Elements) in the form of phases or amplitude masks, or by using microlens arrays or active, preferably dynamically adaptable DOE's, spatial light modulators (SLM) or digital light processing (DLO, Digital Light Processing) via microelectromechanical (MEMS) or microoptical electromechanical (MOEMS) elements and combinations of these elements. Thus arbitrary intensity distributions can be generated, e.g. several focal points or arbitrarily shaped focal points or focal volumes, which allow the writing of a structure with several focal points or focal volumes. Especially advantageous are DOE's for phase modulation, because, compared to DOE's with amplitude masks, these have no or only low power losses. The use of active (transmissive or reflective) spatial light modulators is also possible. A one-dimensional grid with a grid distance of preferably less than 10 µm, preferably down to 1 µm or very preferred down to 100 nm, or a two-dimensional array with a pixel distance of less than 10 µm, preferably of 2 µm or less, can be advantageously used as a mask. The division of the laser beam into dynamically adjustable focal points or focal volumes allows the material properties to be adapted to the structure to be fabricated in a controlled manner. For example, refractive index profiles can be set for optical or photonic applications, variable mechanical properties, which is particularly advantageous in the manufacture of scaffold structures in tissue engineering or in special drug delivery structures, variable dielectric, piezoelectric or magnetic properties, whose property profiles permit novel designs and constructions in an advantageous way, as these can be individually adapted to the respective problem.

Multiple focusing optics can also be used. These can then be moved relative to the carrier material (substrate) so that several structures (with identical or different shapes) can be written simultaneously, each with a focal point or focal volume. The use of several focusing optics requires the laser power to be divided by conventional beam splitters into several beams, each of which is guided to one focusing optics. Finally, a combination of the above beam forming options is possible by first generating the desired intensity distribution of the radiation with a modulator and then focusing it through several optics. Likewise, one modulator or one mask per focusing optics can be used. This embodiment makes it possible to write several structures with several focal points or focal firing volumes at the same time. In an alternative, several focusing optics are used to process a single body or to create a single structure from a liquid or solid material. Such a embodiment with two laterally arranged focusing optics is shown in FIG. 10. Such a embodiment can, for example, reduce the processing time. In these cases, the individual focusing optics are operated with a selected symmetry, for example mirror symmetry, for which the laser beam can be divided with suitable optics, or they are controlled independently of each other.

The position of the focal point (or focal (focus) volume) relative to the material to be solidified can also be freely selected. This can be used to address different starting points for material modification. When using an active, dynamic spatial light modulator, however, the relative position of the focal points can also be dynamically varied. If a certain point in the material is to be processed in a focus area, its position can be corrected e.g. by software if the substrate surface (carrier surface) is known, while if the surface texture is unknown, the data of an optical detection system can be used, for example, in the form of a 3D scanner. The following should be noted in this context:

Important in the (multi-photon) structuring (TPA/MPA) of liquid and/or pasty materials as well as of solid materials is the modification of these materials not only in the volume of the material, but especially also directly on the surface of the substrate. This usually requires an "anchor point" on the surface so that the following structure is in contact with an already solidified area or substrate. If this is not the case, areas in the liquid resin that have already been solidified can drift away from their target position, which impairs the structure quality. This can lead to a defective structure. If the anchor point was not found correctly on the substrate, it can happen, for example, in the case of additive structure generation, that the structure was generated correctly, but it cannot be found on the surface to be processed because it no longer adheres to the substrate when the structure is developed out and is placed in the developer solution. Finding the "anchor points" plays a role not only in the case of additive structure generation, but it is often important for all other applications possible according to the invention that the "anchor point" can be reliably detected as a receptor point for the structuring task for arbitrarily shaped surfaces. Preferred forms of implementation of the invention therefore concern the finding of such an anchor point (or, if applicable, several such anchor points).

In a first such design, this anchor point is detected using a microscope camera installed in the system. This is directed at the surface to be structured; in addition to the resulting structures, it can also be used to observe the laser spot. If this is minimized in the camera image (when moving in the Z-direction), the substrate is hit optimally.

In a second design, the anchor point can be found automatically. For this purpose, the sample already introduced into the bath or the substrate is measured in-situ with a detection system (of any type). The data on the substrate surface obtained in this way are used either to determine the anchor point for each structure individually when writing several structures on a substrate, or to adapt the geometry of a single (large) structure so that it always has a defined orientation to the substrate surface.

There are a number of detection systems that can be used in this context, such as an autofocus, a raster scan of the surface, different sensors, such as a chromatic or a triangulation sensor, or an interferometer. The generated surface data are preferably transferred to the software so that any curvature or shape of the surface to be processed (e.g. substrate surface or virtual or actual surface in or on a body or in a liquid to be solidified) is already taken into account in the manufacturing process. In order to detect the surface more precisely, the focus can always be held in the correct position with a so-called feedback loop, e.g. by using a second carrier to move the positioning system and thus the sample to be processed in the Z-direction, wherein this carrier is held by means of a control loop.

Particularly advantageous is the acquisition of a complete topography image with a sensor that does this in a "one-shot" measurement. Alternatively, a single point sensor, i.e. a sensor that can only ever measure one point in the X-Y-Z plane, can be rasterized over the substrate surface to generate the topography image.

In both cases, these measures help to find the right anchor point. Secondly, it is also possible to re-structure already structured surfaces. For example, additional structures can be applied to previously structured micro- or macro-lenses, or arbitrarily shaped micro-optics (aspherical, free-form, but also spherical) can be coupled with other functional structural elements (such as gratings, diffractive optical elements). In general, any structure can be structured onto an already existing structure or to a component.

A single point sensor is explained in more detail below as an example. A voltage signal is generated which depends on the position of the focal range relative to the substrate or the target anchor point. This singal should reach a certain level when hitting the anchor point with the focus, preferably a maximum. This can be achieved e.g. by the method of the back-reflection in the beam path. Before the structuring laser or the pulses are applied, they pass through a glass plate which is not relevant for the propagation of the pulses. The radiation is then focused into the material as usual. Depending on the Z-position, a small part of the pulses is reflected back because there is a refractive index contrast between the substrate and the liquid resist material. This reflection is maximum if the substrate/resist interface is optimally hit. Then the back-reflection is tapped with the glass plate, which deflects a part of it onto a photodiode. The latter then preferably delivers a maximum in the output voltage value.

In a embodiment, a topography image can be obtained by repeating this maximization of the back-reflection at many points on the substrate and storing the Z positions where the maxima occur. For the back-reflection method, the laser used for structuring may be used as the radiation source. In this case, its power is advantageously set very low in order to eliminate the danger of unintentional solidification of bath material with the light beam intended for back reflection. However, it may be more advantageous to use a second laser that does not interact with the resist and is focused at the same point as the structuring laser. In another embodiment, control can also be used to ensure that a certain signal level of the back-reflection is always maintained by compensating the Z position while the focus is moved in the plane. For this purpose, well-known control systems such as PI or PID controllers, which are prior art, can be used.

Because the focal point or focal (focal) volume is moved relative to the substrate in the XY plane according to the invention and the focal position in Z changes relative to the substrate and thus the signal of the back-reflection, the difference between the target value (the voltage signal in the maximum) and the (dynamic) actual value must be controlled. This control can be carried out via a feedback loop in which the control signal (detector voltage) is passed on to the positioning unit and the position are continuously readjusted. This is usually done via a PID controller and the corresponding algorithms (proportional (P), integral (I) and differential (D) operations) in order to approximate the actual signal to the target signal as quickly and accurately as possible without overshoot.

A PI-controller combines the advantage of the P-controller, namely fast reaction, with the advantage of the I-controller, the exact control. A PI-controlled circuit is therefore somewhat slower than it is, for example, the case when a differential part is introduced into the control circuit (PID controller). A PID controller combines the good characteristics of all three controller types. The PID-regulated circuit is accurate and very fast. A PID controller is therefore well suited for the invention, wherein a PI controller can also be used depending on the respective structuring task. The control properties can be precisely matched to the respective structuring task.

In the device according to this invention, either conventional dielectric mirrors or metal mirrors are used to guide the light beam from the laser into the focusing device.

The use of metal mirrors (e.g. glass coated with gold, silver, aluminium or chromium) makes it possible to structure very broadband, i.e. over a very large spectral range (wavelength range) of approx. 450 nm to 12 µm regardless of the angle of incidence, even with very short pulses (in the range of less than 100 femtoseconds). This is not possible with dielectric mirrors because the electric field of the pulses attacks the electronic bonds of the dielectric layers. To generate very short pulses, high-power short pulse lasers are used instead of the usual ultrashort pulse lasers, which can be used for structuring photochemically reactive materials (polymers, hybrid polymers, glasses) or moderately for metal surfaces: >4 W to some 10 W; pulse energies: from some nJ, e.g. 2 nJ to 120 J, pulse durations <120 fs). This is an important extension of the working conditions with regard to the light sources, as considerably larger process windows can be realized, wherein a large number of materials can be structured. In addition, the interaction time per irradiated pulse is considerably shorter, which can be of great relevance especially for sensitive materials. The structuring of metals, such as metallized surfaces or even shaped bodies or metallic layer systems, in particular magnetic materials, can thus be carried out precisely, efficiently and reliably. A further extension concerns the laser wavelengths that can be used for the process. In addition to the classical laser wavelengths used so far, pulsed lasers with wavelengths below those used so far, i.e. less than 520 nm, can also be used according to the invention. This is particularly advantageous as the efficiency of the process increases with shorter wavelengths and the process window can therefore be significantly increased. This in turn has an influence on the large number of materials that can then be structured using the process. In addition, the achievable structure size and the resolution of structures with smaller wavelengths should become significantly smaller.

In addition to high-power short pulse lasers, a large number of pulsed laser light sources can be used as beam sources, including solid-state lasers, diode-pumped solid-state lasers, semiconductor lasers, fiber lasers, etc. of any wavelength. With particular advantage, a Ytterbium laser system is used in one version of the invention. Its wavelength is in the range of green light when the frequency is doubled. The advantage of Ytterbium lasers over Ti sapphire laser systems, which have a wavelength of approx. 800 nm, is the wavelength of 1030 nm. This is 515 nm with frequency doubling in the green range, which can lead to an improved resolution. In addition, the materials to be structured can be processed more efficiently than with lasers in wavelength ranges of approx. 800 nm. The process window is considerably larger with regard to material formulations. A Ti sapphire laser is about 400 nm with further frequency doubling and a disadvantage in the UV range. However, this spectral range is so rich in energy that a 1PP process could already take place with exposure of most of the material systems to be solidified, which can be avoided by using laser systems with longer wavelengths. Ti sapphire lasers, on the other hand, can be favorable due to the short duration of their laser pulses.

Finally, the use of Ytterbium laser systems is basically possible. It is advantageous that these lasers can be pumped with diodes and no additional pump laser and various other instruments are necessary. The advantage of Ytterbium lasers over Nd:YAG lasers, however, is their relatively short pulses. While Ytterbium lasers can achieve pulses far below one picosecond, the pulse lengths of an Nd:YAG laser are usually larger than one picosecond and thus rather unfavorable for triggering a non-linear absorption, for example for light-induced crosslinking processes, since there is the danger of weakly crosslinked and labile structures, which can lead to the disadvantages described above if these structures are used for optical or photonic applications and products. For biomedical products and applications, it is advantageous to have a large process window and thus be able to adjust the mechanical properties of structures over a wide range, as cells prefer such places on structures for adhesion and proliferation, which are particularly close to natural tissue in their mechanical properties.

The pulse durations required to efficiently trigger non-linear absorption are less than one picosecond. Ultra-short pulsed lasers in the femtosecond range allow multi-photon processes, which generally enable the triggering of light-induced processes. This includes the very localized initiation of cross-linking processes, ablation, redox reactions, phase transitions, restructuring by, for example, recrystallization, etc. In the following, the improvement of light-matter interactions and the more efficient stimulation of polymerization is described. Additional photoinitiators can be used for this purpose. The repetition rate is preferably adjustable between 1 kHz and 80 MHz, preferably between 10 kHZ and 80 MHz. The repetition rate is either determined by means of an acousto-optical modulator, or can be set externally by means of a voltage source, or is achieved in the laser itself (e.g. by Q-switches, by means of an intracavity Mach-Zehnder interferometer (MZI), etc.). In principle, an electro-optical modulator can also be implemented in the laser. In coordination with the given material system, wavelengths in the UV range, in the visible range and in the infrared range can be used. In particular, the lasers can have powers between 100 mW and 5 W, preferably between 150 mW and 2 W, and/or a pulse duration of less than 1 picosecond and/or a repetition rate between 1 and 80 MHz.

According to another proposal, the system can be equipped with a scanner, in particular a 2D scanner, combined with a movement in the third spatial direction in Z, which then describes a 3D scanner.

The synchronized movement of X, Y and Z directions with such a scanner system (e.g. a galvo scanner, i.e. two mirrors rotatable in one plane each to move the laser beam) with a small Field of View (FoV) is surprisingly suitable for producing structures on arbitrarily large surfaces without stitching, i.e. without joining structuring fields that necessarily result from the restricted FoV. For example, errors due to joining structures together on large surfaces in the continuous structure can be avoided. The farther away the light falls from the centre of the galvo mirror, the greater are the deviations or errors in the structured products. This problem is usually solved by using large galvo mirrors, which usually make the equipment very large and heavy (weighing more than 10 kg). This is avoided according to the invention. The scanner can thus also be very small to write areas of any size, so that the footprint of the system, i.e. the total size (area and height) of the system, remains small and the structure is essentially determined only by the size of the positioning device and the laser system with the optics required for the structuring process. At the same time, the arrangement is selected so that the three positioning axes can be moved in X, Y and Z (or only the scanner is used in combination with the Z positioning axis in a synchronised movement, then with the FoV, which is possible with the optics used, wherin larger surfaces can be stitched if needed, or synchronised movement of the scanner and the X, Y and Z positioning unit is carried out in all spatial directions). In the process this has the advantage that, during the structuring process, acceleration and deceleration distances can be dispensed with, since the scanner system, in contrast to mechanical or piezoelectric motion components such as positioning tables and the like, has a negligible inertia or no creep. Thus, the structuring process is already faster per se. The speed is also increased by the scanner itself, because the laser beam can be moved considerably faster in X and Y direction than the sample, because the scanner mirrors have a negligible inertia. If such a scanner system is present, it is therefore possible in some cases (if the object lies within the FoV) to limit the movement of the sample to a minimum and to completely dispense with such a movement. By combining the scanner system with an X-Y stage or the first carrier comprising 3 rotatory and 3 translatory degrees of freedom, it is possible to work without stitching in the so-called Infinite FoV mode, where the scanner performs the fine movements and the stage or device performs the coarse movements. Thus, both advantages of the individual systems are combined: the speed and flexibility of the scanner with the large-area structuring option of the positioning stages. In particular, structures produced with the device without stitching can be used as master structures for further impression techniques. Both a single use and a multiple use of the same master are intended. Structuring can also be carried out in "Mixed Mode" synchronized with the XY movement; the entire field of view of the scanner, which is variable by the optics used, is used to write the structure, wherein the positioning stages then carry out the XY movement to the next structuring point.

In an alternative to the invention described above, a device ("alternative device according to point 1") for laser-assisted processing of a material adhering to a substrate or of a substrate-associated or substrate-free body or of its surface, in particular by TPA/MPA and/or by treatment with a pulsed laser, is provided, comprising a positioning system (10, 11) which permits movement in the X-Y direction (11) and/or Z axis and/or an axis of rotation (10) and optionally additionally three translational and three rotational degrees of freedom and has a sample holder, the sample holder being designed such that it can hold the substrate (7) to which the material to be processed adheres or with which the body to be processed is associated, or—in the absence of a substrate—the body (7) to be processed, a laser source (1) which can emit laser pulses or laser pulse sequences, and focusing optics (6) which can shape the laser pulses or laser pulse sequences in such a way that they impinge in a focal point or a focal volume in the region of the material or body to be processed in such a way that a 2- or multi-photon polymerization can take place there, or in that they impinge in a focal point or in a focal volume in the region of the body in such a way that material located in this focal point or focal volume is subjected to the desired chemical and/or physical changes.

In this alternative device, the focusing optics are preferably not movable. In addition, this alternative can be combined with all the configurations, embodiments and forms of implementation and processes described above for or in connection with the device, the positioning system of which necessarily permits three degrees of translational and three rotational degrees of freedom and preferably consists of or contains a hexapod. All the above explanations of the device, the positioning system of which necessarily permits three degrees of translational and three rotational degrees of freedom, as well as the processing methods that can be performed with it, are therefore to be understood here again in connection with the alternative device according to point 1.

The present invention therefore further contains the following features:

2. an alternative device according to point 1, wherein in the positioning system a rotation axis (10) is mounted on a positioning unit (11) movable in the X-Y direction, the rotation axis being a Z-direction aligned rod, the length of which is preferably variable, or wherein the positioning system is composed of a plurality of partial carriers (partial positioning stages).
3. an alternative device as defined in point 1 or 2, where the positioning system or at least one of the sub-carriers is air supported and/or can be driven mechanically and/or piezoelectrically.
4. An alternative device according to one of the above points, wherein the sample holder is provided with a holder for the substrate or the body.
5. An alternative device according to one of the preceding points, wherein the positioning system (10, 11) further comprises a chuck in the form of a hollow body (8) whose upper side is configured as a perforated plate with or without grooves for supporting the substrate or body and which has a suction opening for controllable air extraction.
6. An alternative device according to point 5, wherein the perforated plate of the chuck is made removable and the remainder of the hollow body is designed such that its upper side can be closed off by perforated plates of different sizes and/or shapes, and/or wherein the chuck is divided into a plurality of areas whose air extraction can be controlled separately.
7. An alternative device according to point 5 or 6, further comprising a rigid or flexible carrier for the chuck, in particular a rubberized mat or a silicone mat perforated with small holes.
8. An alternative device according to any of points 5 to 7 wherein the chuck can be used to compensate for a wedge error.
9. An alternative device according to of one of the preceding points, wherein the focusing optics (6) is located above the sample holder such that in operation of the device it is located above the substrate (7) or body (7) held by the sample holder.
10. An alternative device downstream according to one of the preceding points, in which the focusing optics (6) is located below the sample holder so as to be located, during operation of the device, below the substrate (7) or body (7) held by the sample holder, the sample holder consisting of or comprising a mounting (19) enabling a position of the material or body to be processed spaced from the positioning system (10, 11) and having free space to receive the focusing optics.
11. An alternative device according to any one of points 1 to 9, wherein the positioning system is configured such that the sample holder is rotatably arranged about an axis arranged in a plane, said axis being laterally coupled to a component of the positioning system and preferably laterally displaceable in a direction forming a right angle with said axis.
12. An alternative device according to one of the above points, comprising at least one rotatable (4) and/or non-rotatable deflecting mirror (5), preferably selected from dielectric mirrors and mirrors having a metallic surface, in particular formed of gold, silver, aluminium or chromium, and combinations of dielectric mirrors and mirrors having a metallic surface.
13. An alternative device according to one of the above points, comprising a three-dimensional scanner system in which a 2D scanner with rotatably mounted mirrors, which can execute a movement in X and Y direction, is combined with a movement in the third spatial direction (Z), wherein the scanner system is preferably equipped with a piezoelectric drive, in particular a piezoelectric motor.
14. An alternative device according to point 14 or 15, wherein the three-dimensional scanner system is a galvo scanner system having at least two deflection mirrors (4).

An alternative method in which a material adhering to a substrate or a substrate-associated or substrate-free body or surface thereof is to be processed, wherein the laser-assisted method uses in particular a laser with which TPA/MPA can be carried out and/or in which a treatment takes place with a pulsed laser, characterised in that it is carried out using an alternative device according to one of points 1 to 14. This method further includes the various more specific methods mentioned above, which are listed in connection with the device described in detail above, the positioning system of which necessarily permits three translational degrees of freedom and three rotational degrees of freedom and preferably consists of or contains a hexapod.

The invention claimed is:

1. A device for laser-assisted processing of a material adhering to a substrate or a body, being a substrate-associated or substrate-free body, or of its surface, the device comprising:
a positioning system enabling three translational and three rotational degrees of freedom and having a sample holder, said sample holder being adapted to hold the substrate to which the material to be processed adheres or to which the body to be processed is associated or, in an absence of the substrate, the body to be processed;
a laser source emitting laser pulses or laser pulse sequences;
focusing optics shaping the laser pulses or the laser pulse sequences such that they impinge in a focal point or a focal volume in a region of the material or the body to be processed in such a way that a two-photon or multi-photon polymerization can take place there, or in that they impinge in the focal point or in the focal volume in the region of the body such that the material located in the focal point or the focal volume is subjected to a desired chemical and/or physical changes;
said positioning system having a first carrier in a form of an apparatus with a first base and a plurality of up to six legs mounted on said first base and which are connected to a second base, a length and an angle of each of said legs being variable and which are connected to a second base; and
said positioning system having a second carrier capable of executing movement in the X-Y directions and/or the Z direction and capable of executing rotary movement about a rotation axis.

2. The device according to claim 1, wherein:
said first carrier is fastened on or to said second carrier or said second carrier is fastened on or to said first carrier; or
said first carrier is embedded in said second carrier and/or fastened by means of a suction vacuum and/or wherein said second carrier is screwed to said sample holder.

3. The device according to claim 2, further comprising clamps and said first carrier is fastened on or to said second carrier or said second carrier is fastened on or to said first carrier by means of said clamps.

4. The device according to claim 1, wherein:
said second carrier has a positioning unit and in said second carrier the axis of rotation is mounted on said positioning unit which can be moved in the X-Y direction, the axis of rotation being a rod which is aligned in a Z direction; or
said second carrier is constructed from a plurality of partial carriers.

5. The device according to claim 4, wherein:
a length of said rod is variable; or
said partial carriers in each case being air-mounted and/or being able to be driven mechanically and/or piezoelectrically.

6. The device according to claim 1, wherein said sample holder has a holder for the substrate or the body.

7. The device according to claim 1, wherein said positioning system has a chuck in a form of a hollow body, said chuck has an upper side configured as a perforated plate with or without grooves for supporting the substrate or the body and said hollow body has a suction opening formed therein for controllable air suction.

8. The device according to claim 7, wherein:
said perforated plate of said chuck is made removable and a remainder of said hollow body is configured such that an upper side can be closed off by perforated plates of different sizes and/or shapes; and/or
said chuck is divided into a plurality of regions whose air extraction can be controlled separately from each other.

9. The device according to claim 7, wherein said chuck can be used to compensate for a wedge error.

10. The device according to claim 1, wherein said focusing optics are disposed above said sample holder such that said focusing optics are disposed above the substrate or the body held by said sample holder when the device is being operated.

11. The device according to claim 1, wherein:
said focusing optics are disposed below said sample holder in such a way that said focusing optics are disposed below the substrate or the body held by said sample holder when the device is being operated; and
said sample holder has a mounting which permits a position of the material or the body to be processed at a distance from said positioning system and has free space for receiving said focusing optics.

12. The device according to claim 1, wherein said positioning system is configured such that said sample holder is disposed to be rotatable about an axis disposed in a plane, the axis being coupled laterally to a component of said positioning system and laterally displaceable in a direction forming a right angle with the axis, a coupling of said sample holder being rotatable about the axis disposed in the plane being effected via said first carrier.

13. The device according to claim 1, further comprising at least one rotatable and/or non-rotatable deflecting mirror.

14. The device according to claim 13, wherein said deflecting mirror is selected from the group consisting of dielectric mirrors, mirrors with a metallic surface, and combinations of said dielectric mirrors and mirrors with said metallic surface.

15. The device according to claim 1, further comprising a three-dimensional scanner system, in said three-dimensional scanner system a 2D scanner with rotatably mounted mirrors, which can execute movements in X and Y directions, is combined with a movement in a third spatial direction, wherein said three-dimensional scanner system has a piezoelectric drive.

16. The device according to claim 15, wherein said three-dimensional scanner system is a galvo scanner system having at least two deflecting mirrors.

17. The device according to claim 1, wherein said focusing optics are configured to be immersible in the material to be processed.

18. A laser-assisted method in which a material adhering to a substrate or a body, being a substrate-associated or substrate-free body, or its surface is to be processed, which comprises the steps of:
providing the device according to claim 1; and using the device on the substrate or the body to perform a two-photon or multi-photon absorption process and/or a treatment with a pulsed laser.

* * * * *